United States Patent
Koga

(10) Patent No.: US 7,477,390 B2
(45) Date of Patent: Jan. 13, 2009

(54) EXPOSURE METHOD AND APPARATUS, AND DEVICE MANUFACTURING METHOD

(75) Inventor: Shinichiro Koga, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 445 days.

(21) Appl. No.: 11/245,241

(22) Filed: Oct. 7, 2005

(65) Prior Publication Data

US 2006/0077388 A1 Apr. 13, 2006

(30) Foreign Application Priority Data

Oct. 8, 2004 (JP) .............................. 2004-296689

(51) Int. Cl.
G01B 11/00 (2006.01)
G03B 27/42 (2006.01)
G03B 27/32 (2006.01)
G03F 9/00 (2006.01)

(52) U.S. Cl. .......................... 356/401; 355/53; 355/77; 430/22

(58) Field of Classification Search ........................ None
See application file for complete search history.

(56) References Cited

U.S. PATENT DOCUMENTS

| | | | | |
|---|---|---|---|---|
| 4,861,162 A | | 8/1989 | Ina | 356/401 |
| 5,978,071 A | * | 11/1999 | Miyajima et al. | 355/53 |
| 5,986,766 A | | 11/1999 | Koga et al. | 356/401 |
| 6,342,703 B1 | | 1/2002 | Koga et al. | 250/548 |
| 6,538,260 B1 | | 3/2003 | Koga | 250/548 |
| 6,710,849 B2 | | 3/2004 | Kwan et al. | 355/53 |
| 7,009,683 B2 | * | 3/2006 | Sato | 355/53 |
| 2002/0026878 A1 | | 3/2002 | Kwan et al. | 101/463.1 |
| 2005/0237507 A1 | | 10/2005 | Koga | 355/55 |

FOREIGN PATENT DOCUMENTS

| | | |
|---|---|---|
| JP | 1-49007 B2 | 10/1989 |
| JP | 1-49007 | 11/1989 |
| JP | 3-21009 | 1/1991 |
| JP | 9-218714 | 8/1997 |
| JP | 2002-158168 | 5/2002 |
| JP | 2003-59807 | 2/2003 |

OTHER PUBLICATIONS

Japanese Office Action dated Oct. 6, 2006, issued in corresponding Japanese patent application No. 2004-296689.
Abstract for corresponding Japanese patent document No. 61-263123.

* cited by examiner

*Primary Examiner*—Gregory J Toatley, Jr.
*Assistant Examiner*—Gordon J Stock, Jr.
(74) *Attorney, Agent, or Firm*—Fitzpatrick, Cella, Harper & Scinto

(57) ABSTRACT

An exposure method of exposing a substrate arranged on a stage, which holds the substrate and moves, to light through an original and a projection optical system. A first measurement is performed for measuring a first drive characteristic of the stage by detecting a position of a pattern on the stage using a first detection system, which detects a position of a pattern on the substrate through an optical system, which does not include the projection optical system, a second measurement is performed for measuring a second drive characteristic of the stage by detecting the position of the pattern on the stage using a second detection system, which detects the position of the pattern on the stage through the projection optical system, and the original and the substrate are aligned based on the first and second drive characteristics.

15 Claims, 13 Drawing Sheets

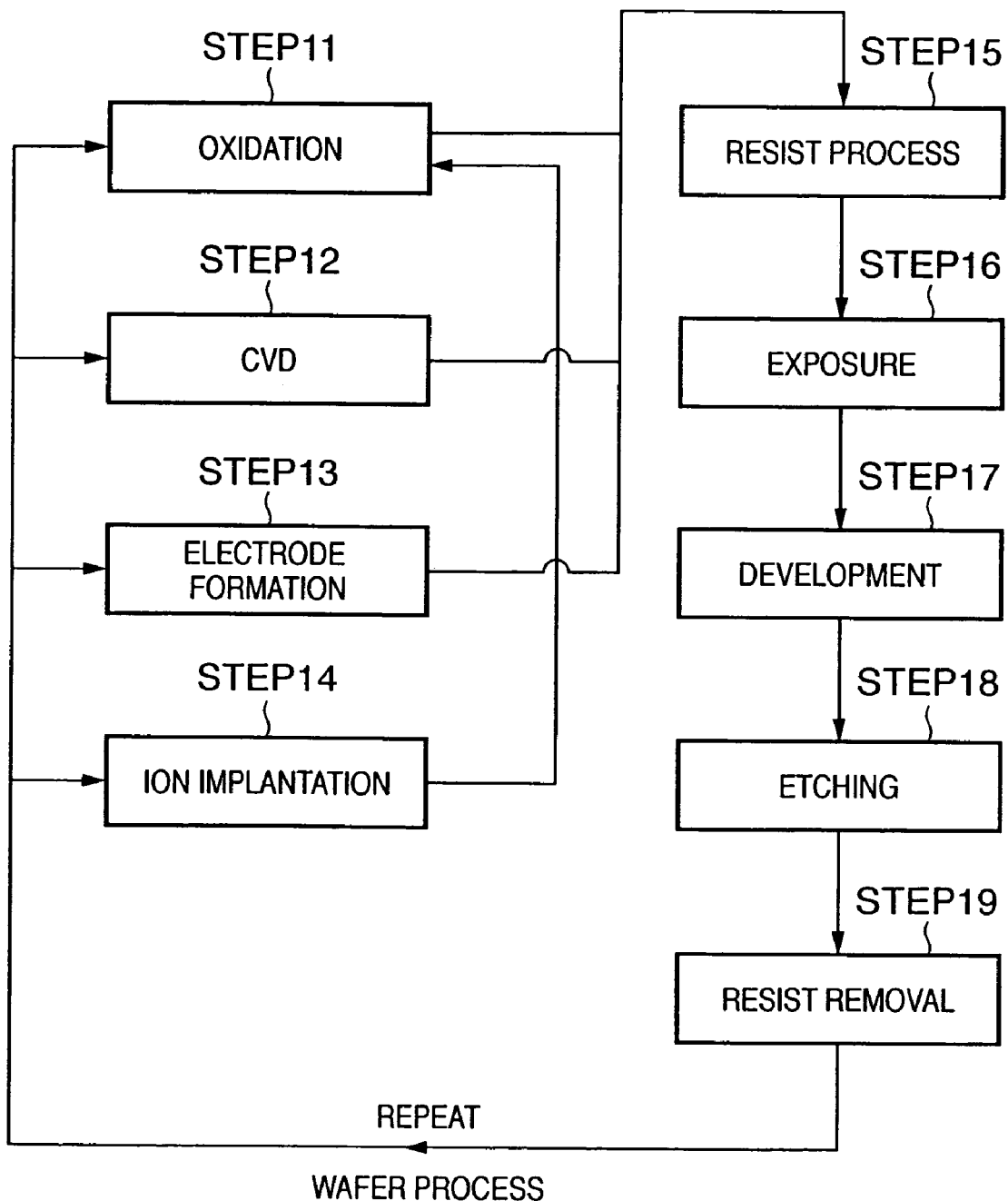

EXPOSURE METHOD AND APPARATUS, AND DEVICE MANUFACTURING METHOD

CLAIM OF PRIORITY

This application claims priority from Japanese Patent Application No. 2004-296689, filed on Oct. 8, 2004, which is hereby incorporated by reference herein.

FIELD OF THE INVENTION

The present invention relates to an exposure method and apparatus. More particularly, though not exclusively, the present invention relates to an exposure method and apparatus which align an original, such as a mask or reticle with a substrate, such as a semiconductor wafer, accurately, to expose the substrate to light through the original.

BACKGROUND OF THE INVENTION

In recent years, as semiconductor integrated circuits, such as ICs or LSIs or a liquid crystal panel, are micronized, and their integration degree increases, the accuracy and function of an exposure apparatus, such as a semiconductor exposure apparatus, improve. In particular, in alignment of an original, such as a mask or reticle, and a substrate, such as a semiconductor wafer, a technique, which overlays the original and substrate on the order of several nm to be promising, is expected. As an exposure apparatus used in the manufacture of devices, such as semiconductor integrated circuits, an apparatus, called a stepper or a step and scan, is used often.

This apparatus sequentially transfers a pattern formed on an original (e.g., a reticle) to a plurality of portions of the substrate (e.g., a semiconductor wafer). An apparatus that performs this transfer is collectively called a stepper, and an apparatus that performs this transfer while scanning a stage is called a step and scan.

Alignment of the original and substrate in the exposure apparatus will be described.

An example of alignment of the original and substrate in the exposure apparatus includes a die-by-die alignment scheme, which performs alignment by measuring the exposure position for each exposure. A global alignment scheme is also available, which performs position measurement at an appropriate number of measurement points in advance, and creates a correction equation of the exposure position from the measurement result to perform alignment.

The global alignment scheme is an excellent scheme with which a high throughput and high accuracy can be obtained. According to the global alignment scheme, alignment is performed according to one correction equation for the entire area of the substrate. Hence, the state of alignment can be judged by examining several points of the substrate, leading to an advantage in usage as well. To perform alignment, the alignment target itself or an alignment mark arranged in its vicinity must be detected. An example of a detection scheme for this includes the following two schemes:

1. The TTL (Through The Lens) scheme with which the position of the alignment mark is measured through a projection optical system.

2. The OA (Off Axis) scheme with which the position of an alignment mark is measured directly and not through a projection optical system.

When the original and substrate are to be aligned by the OA scheme, the base line amount as the gap between the measurement center of an alignment detection system and the projection image center (exposure center) of the original pattern must be known.

More specifically, the substrate must be moved to a position which is obtained by correcting the position of a target exposure region (also called a shot region), which is measured by using the alignment detection system, with the base line amount, so that the center of the shot region is correctly aligned with the exposure center. During use of the exposure apparatus, sometimes, the base line amount gradually fluctuates. When fluctuation in the base line amount occurs, the alignment accuracy (overlaying accuracy) decreases.

To prevent this, conventionally, the base line amount is measured periodically.

So far, the conventional exposure apparatus and alignment with the exposure apparatus have been described briefly.

A prior art (first prior art) arrangement of alignment of a wafer and a reticle in a semiconductor exposure apparatus will be described with reference to FIG. 2.

Referring to FIG. 2, reference numeral 1 denotes an illumination optical system; reference numeral 2, a reticle serving as an original; reference numeral 3, a projection optical system; and reference numeral 4, a wafer serving as a substrate. The image of the reticle 2 illuminated by the illumination optical system 1 is projected onto the wafer 4 through the projection optical system 3. Reference numeral 5 denotes a wafer stage; reference numeral 6, a wafer chuck; and reference numeral 7, a wafer stage controller. The wafer 4 is placed on the wafer chuck 6 on the wafer stage 5 by a wafer transport device (not shown). The wafer stage 5 is positioned by the wafer stage controller 7. Reference numeral 8a and 8b denote TTL alignment detection systems, respectively; reference numeral 9, an OA alignment detection system; reference numeral 10, a height detection unit; and reference numeral 11, a controller or processor which controls the exposure apparatus and executes various calculations.

FIG. 7 is a view of the wafer stage 5 when seen from the direction of the projection optical system 3. The wafer stage 5 has a reference mark 12, equivalent to an alignment mark, formed on the surface of the wafer 4, or a reference member 12 having such a reference mark, at a position where it does not interfere with the wafer 4, as shown in FIG. 7.

The reticle 2 has marks RMa and RMb at positions symmetrical with reference to a center C, as roughly shown in FIG. 8. The reticle 2 is held on a reticle stage (not shown). The reticle stage moves the reticle 2 to a position where the center C coincides with an optical axis AX of the projection optical system 3.

The wafer stage 5 is positioned such that the reference mark on the wafer stage 5 falls on a predetermined position in the projection field of the projection optical system 3. Then, the TTL alignment detection system 8a provided above the reticle 2 can detect the mark RMa of the reticle 2 and the reference mark simultaneously. When the wafer stage 5 is moved to another position, the TTL alignment detection system 8b can detect the mark RMb of the reticle 2 and the reference mark simultaneously. The OA alignment detection system 9 is fixed outside the projection optical system 3 (outside the projection field). An optical axis OX of the OA alignment detection system 9 is parallel to the optical axis AX of the projection optical system 3.

The exposure method of the first prior art exposure apparatus will be described with reference to FIG. 9.

Referring to FIG. 9, step S301 is a base line measurement step. The position of the wafer stage 5, obtained when the mark RMa of the reticle 2 and the reference mark on the reference member 12 are aligned by using the TTL alignment detection systems 8a and 8b, is measured by an interferometer, such as a laser interferometer (not shown).

Similarly, the position of the wafer stage 5, obtained when the mark RMb of the reticle 2 and the reference mark on the reference member 12 are aligned by using the TTL alignment detection systems 8a and 8b, is measured by the interferometer, such as the laser interferometer described above.

The reference mark on the reference member 12, obtained when the wafer stage 5 is located at the central position (average value) of the position of the wafer stage 5 with respect to the marks RMa and RMb, is on the optical axis AX of the projection optical system 3, and located at a position conjugate with the center C of the reference member 12.

Similarly, the position of the wafer stage 5, obtained when the reference mark on the reference member 12 is aligned with the OA alignment detection system 9, is measured by the interferometer, such as the laser interferometer described above. A base line amount BL is obtained by calculating the difference between the central position (position of the optical axis AX) (described above) detected by the TTL alignment detection systems 8a and 8b and the position (position of the optical axis OX) (described above) detected by the OA alignment detection system 9.

Step S302 is a wafer pattern position measurement step. In the wafer pattern position measurement step, the position error amount of the pattern (wafer pattern) on the wafer 4 is measured with reference, as an origin, to the position to which the wafer stage 5 has been moved from the exposure center position by the base line amount BL measured in the base line measurement step.

More specifically, the positions of a plurality of alignment marks on the wafer 4 are measured by the OA alignment detection system 9 to create a correction equation for global alignment. Namely, the shift, magnification offset, rotation, and the like, of the wafer pattern, are measured. As a conventional example of the wafer pattern position measurement step, for example, one proposed by Japanese Patent Laid-Open No. 9-218714 is available.

Japanese Patent Laid-Open No. 9-218714 proposes an example of the global alignment scheme. Particularly, a high-order error factor is also corrected to improve the alignment accuracy. A simple example of the correction equation includes the following equations (1) and (2):

$$d_{wx} = M_{wx}*x + \theta_{wx}*y + S_{wx} \quad (1)$$

$$d_{wy} = \theta_{wy}*x + M_{wy}*y + S_{wy} \quad (2)$$

where $d_{wy}$ and $d_{wy}$ are the position error amounts at a coordinate point (x, y) on the wafer 4. An X-direction magnification offset $M_{wx}$, Y-direction magnification offset $M_{wy}$, X-direction rotation $\theta_{wx}$, Y-direction rotation $\theta_{wy}$, X-direction shift $S_{wx}$, and Y-direction shift $S_{wy}$ of the pattern on the wafer 4 as the respective coefficients can be obtained by the method of least squares.

Step S303 is an exposure step. In the exposure step, the wafer stage 5 is driven on the basis of the base line amount and the position error amount of the pattern on the wafer 4, which is measured in the wafer pattern position measurement step, to transfer the pattern of the reticle 2 onto the wafer 4.

So far, the exposure apparatus and alignment of the wafer and reticle according to the first prior art arrangement have been described.

An exposure apparatus and alignment of the wafer and reticle according to another prior art (second prior art) arrangement will be described.

As described above, the ICs and LSIs have been rapidly shrinking in feature size, and each year, a higher apparatus performance is demanded for a semiconductor manufacturing apparatus. In recent years, an improvement in productivity is strongly sought to accompany the increasing demands for semiconductors represented by DRAMs. Thus, not only an increase in accuracy, but also, an increase in throughput, is demanded for the semiconductor manufacturing apparatus.

In view of this, Japanese Patent Publication No. 1-49007 B2 separately has a function (to be referred to as a measurement station hereinafter) for measuring a pattern position on a wafer and a function (to be referred to as an exposure station hereinafter) for exposing the wafer to light. More specifically, an exposure apparatus, which performs a measurement process and exposure process simultaneously, is proposed. As an example of this exposure apparatus, the second prior art arrangement will be described with reference to FIG. 5.

The exposure apparatus according to the second prior art arrangement includes a measurement station 13, an exposure station 14, a wafer supply unit 15, and a controller 11. The measurement station 13 measures the relative positional relationship between a wafer chuck serving as a wafer support and a pattern on a wafer. After the relative positional relationship between the reticle and wafer chuck is measured, the exposure station 14 projects the pattern of the reticle to the wafer and exposes the wafer to light. The wafer supply unit 15 transfers the wafer and wafer chuck between the measurement station 13 and exposure station 14. The controller 11 controls the measurement station 13, exposure station 14, and wafer supply unit 15.

In the measurement station 13, reference numeral 9 denotes an OA alignment detection system; reference numeral 4a, a wafer serving as a target exposure substrate; reference numeral 6a, a wafer chuck; reference numeral 5a, a wafer stage; and reference numeral 10, a height detection unit. The wafer chuck 6a serves as a substrate support which mounts and holds the wafer 4a on it. The wafer stage 5a mounts the wafer chuck 6a on it and its position is measured by a stage controller 7a to position the wafer 4a.

In the exposure station 14, reference numeral 3 denotes a projection optical system; reference numerals 8a and 8b, TTL alignment detection systems; reference numeral 1, an illumination optical system; and reference numeral 5b, a wafer stage. The projection optical system 3 projects the image of a reticle 2 onto a wafer 4b. The position of the wafer stage 5b is measured by a stage controller 7b, which positions a wafer chuck 6b on which the wafer 4b is mounted.

FIG. 10 is a view of the wafer chuck 6b when seen from the direction of the projection optical system 3. Reference members 12a and 12b are fixed to each of the wafer chucks 6a and 6b, respectively having reference marks equivalent to the alignment marks formed on the surfaces of the corresponding wafers 4a and 4b, at positions where they do not interfere with the wafer 4a, as shown in FIG. 10.

According to this prior art arrangement, the pattern of the reticle is exposed to the wafer in the following procedure.

First, in the measurement station 13, the alignment mark positions on the wafer chuck 6a and wafer 4a are measured by using the OA alignment detection system 9 to measure the relative positional relationship between the wafer chuck 6a and the pattern on the wafer 4a. At this time, in the exposure station 14, the wafer 4b is exposed to light simultaneously with the procedure to be described hereinafter.

Subsequently, the exposed wafer 4b and wafer chuck 6b are unloaded from the exposure station 14 by using the wafer supply unit. The wafer 4a and wafer chuck 6a of the measurement station 13 are supplied to the exposure station 14.

In the exposure station 14, the alignment mark position on the wafer chuck 6b is measured by the TTL alignment detection systems 8a and 8b through the reticle 2 to measure the relative positional relationship between the pattern on the reticle 2 and the wafer chuck 6b. In addition, the relative positional relationship between the patterns on the reticle 2 and wafer 4b is calculated by using the relative positional relationship between the wafer chuck 6a and the pattern on the wafer 4a measured in the measurement station 13. Finally, the pattern of the reticle 2 is exposed onto the wafer 4b on the basis of the calculated relative positional relationship between the calculated patterns on the reticle 2 and wafer 4b.

According to this prior art arrangement, the process of the measurement station 13 and that of the exposure station 14 can be performed simultaneously, so that the total processing time of accurate alignment and wafer exposure can be shortened.

A case has been described wherein the wafer chuck is used as a substrate which supports the wafer when the wafer is to be moved between the measurement station 13 and exposure station 14. However, the present invention is not limited to this. For example, the wafer stages 5a and 5b can be used as substrate supports when the wafer is to be moved. In this case, in place of detecting the alignment mark on the wafer chuck, the alignment marks on the wafer stages are detected in the same manner.

The exposure method of the exposure apparatus according to the second prior art arrangment will be described with reference to FIG. 11.

Referring to FIG. 11, step S401 is a measurement position chuck mark position measurement step. In step S401, the reference mark positions on the reference members 12a and 12b on the wafer chuck 6a are measured by using the OA alignment detection system 9. As shown in FIG. 10, the wafer chuck 6a has, as alignment marks, reference marks at least on the two reference members 12a and 12b. These reference marks are measured by the OA alignment detection system 9. Thus, the position and rotation amount of the wafer chuck 6a, with respect to the OA alignment detection system 9, are measured.

Step S402 is a wafer pattern position measurement step. In step S402, the alignment mark position on the wafer chuck 6a is measured in the measurement station 13 by using the OA alignment detection system 9. Thus, the position of the pattern (wafer pattern) on the wafer 4a is measured. The wafer pattern position measurement step is identical to that of the first prior art arrangement described above, and a detailed description thereof will be omitted. The relative positional relationship between the wafer chuck 6a and the pattern on the wafer 42 is measured by the measurement position chuck mark position measurement step and the wafer pattern position measurement step.

Step S403 is an exposure position chuck mark position measurement step. In step S403, the positions of the reference marks on the reference members 12a and 12b of the wafer chuck 6b are measured in the exposure station 14 by the TTL alignment detection systems 8a and 8b through the reticle 2. Thus, the relative positional relationship (position and rotation amount) between the pattern on the reticle 2 and the wafer chuck 6 b is obtained.

Step S404 is an exposure step. In step S404, the relative positional relationship between the pattern on the reticle 2 and the pattern on the wafer 4b is calculated by using the relative positional relationship between the wafer chuck 6a and the pattern on the wafer 4a, which is measured in steps S401 and S402 and the relative positional relationship between the pattern on the reticle 2 and the wafer chuck 6b, which is measured in step S403. The wafer stage 5b is driven on the basis of the calculated relative positional relationship to transfer the pattern of the reticle 2 onto the wafer 4b.

So far, the exposure apparatus and alignment of the wafer and reticle according to the second prior art arrangement have been described.

The prior art arrangements discussed above enable highly accurate alignment of the reticle and wafer, with a high throughput.

In recent years, a further demand has arisen from an improvement in alignment accuracy, and accordingly, an error component, which is conventionally regarded as an infinitesimal amount, has become non-negligible. For example, if the wafer stage drive characteristic differs between the measurement position and exposure position of the first prior art arrangement, an alignment error can occur. Similarly, if the wafer stage drive characteristic differs between the measurement station and exposure station of the second prior art, an alignment error can occur. Such a difference in wafer stage drive characteristic will be referred to as a stage drive characteristic difference.

Conventionally, in the manufacture of the exposure apparatus, the stage drive characteristic at the measurement position or measurement station and that at the exposure position or exposure station are adjusted such that the error component becomes an infinitesimal amount. In addition, the error component, including the stage drive characteristic difference, is measured in advance, and corrected as an offset.

If, however, the stage drive characteristic difference changes because, e.g., the stage drive characteristic changes over time, an alignment error can occur, even if it is infinitesimal. Such an error can become non-negligible in meeting the future demand for an improvement in alignment accuracy.

SUMMARY OF THE INVENTION

The present invention has been made in view of the above background. It is an exemplary object of the present invention to improve the alignment accuracy.

According to the present invention, the foregoing object is attained by providing an exposure method of exposing a substrate arranged on a stage, which holds the substrate and moves, to light through an original and a projection optical system, the method comprising:

a first measurement step of measuring a first drive characteristic of the stage by detecting a position of a pattern on the stage using a first detection system, which detects a position of a pattern on the substrate through an optical system which does not comprise the projection optical system;

a second measurement step of measuring a second drive characteristic of the stage by detecting the position of the pattern on the stage using a second detection system which detects the position of the pattern on the stage through the projection optical system; and aligning the original and the substrate based on the first and second drive characteristics.

In a preferred embodiment, the first and second measurement steps measure positions with respect to a same reference mark on the stage, respectively.

In a preferred embodiment, the first measurement step is performed at a measurement station, the second measurement step is performed at an exposure station, and the first and second measurement steps measure positions with respect to a same reference mark on either one of a substrate chuck and the stage, respectively.

In a preferred embodiment, the apparatus further comprises a step of storing a difference between the first and second drive characteristics in a storage medium, wherein the aligning step aligns the original and the substrate based on the difference stored in the storage medium.

In a preferred embodiment, the first and second measurement steps are performed on each of the substrates.

In a preferred embodiment, the second measurement step is performed if a change amount of the first drive characteristic exceeds a tolerance.

In a preferred embodiment, the drive characteristic comprises at least one of a drive magnification offset and a drive rotation.

According to the present invention, the foregoing object is attained by providing an exposure method of exposing a substrate arranged on a movable stage to light through an original and a projection optical system, the method comprising:

a first measurement step of measuring positions of a plurality of reference marks on the movable stage by using a first measurement system which sequentially measures the positions of the plurality of reference marks through the projection optical system;

a first determination step of determining a first relationship to approximately obtain the plurality of positions measured in the first measurement step from set positions of the plurality reference marks;

a second measurement step of measuring the positions of the plurality of reference marks by using a second measurement system, which sequentially measures the positions of the plurality of reference marks through an optical system which does not include the projection optical system;

a second determination step of determining a second relationship to approximately obtain the plurality of positions measured in the second measurement step from the set positions of the plurality of reference marks;

a third measurement step of measuring positions of a plurality of marks on the substrate held by the movable stage by using the second measurement system;

a third determination step of determining a third relationship to approximately obtain the plurality of positions measured in the third measurement step from set positions of the plurality of marks on the substrate; and a calculation step of calculating positions of regions on the substrate to be exposed to the light based on set positions of the regions, the third relationship, and a difference between the first and second relationships.

In a preferred embodiment, the plurality of reference marks on the movable stage comprise a plurality of marks formed on a chuck which supports the substrate.

According to the present invention, the foregoing object is attained by providing an exposure apparatus for exposing a substrate to light through an original, the apparatus comprising:

a projection optical system configured to project a pattern of the original onto the substrate;

a stage configured to hold the substrate and to move;

a first measurement unit configured to measure a position of a pattern on the substrate and a position of a pattern on the stage, the first measurement unit comprising an optical system which does not comprise the projection optical system; and a second measurement unit configured to measure the position of the pattern on the stage through the projection optical system, wherein the original and the substrate are aligned based on a measurement result by the first measurement unit, a measurement result by the second measurement unit, a drive characteristic of the stage for measurement by the first measurement unit, and a drive characteristic of the stage for measurement by the second measurement unit.

According to the present invention, the foregoing object is attained by providing an exposure apparatus for exposing a substrate to light through an original, the apparatus comprising:

a projection optical system configured to project a pattern of the original onto the substrate;

a chuck configured to hold the substrate;

a stage configured to hold the chuck and to move;

a first measurement unit configured to measure a position of a pattern on the substrate and a position of a pattern on the chuck, the first measurement unit comprising an optical system which does not comprise the projection optical system; and a second measurement unit configured to measure the position of the pattern on the chuck through the projection optical system, wherein the original and the substrate are aligned based on a measurement result by the first measurement unit, a measurement result by the second measurement unit, a drive characteristic of the stage for measurement by the first measurement unit, and a drive characteristic of the stage for measurement by the second measurement unit.

According to the present invention, the foregoing object is attained by providing an exposure apparatus for exposing a substrate to light through an original, the apparatus comprising:

a projection optical system configured to project a pattern of the original onto the substrate;

a stage configured to hold the substrate and to move;

a first measurement unit configured to sequentially measure positions of a plurality of reference marks on the stage through the projection optical system;

a measurement optical system which does not comprise the projection optical system;

a second measurement unit configured to sequentially measure any of the positions of the plurality of reference marks and positions of a plurality of marks on the substrate held by the stage through the measurement optical system; and a controller configured to determine a first relationship to approximately obtain the positions of the plurality of reference marks measured by the first measurement unit from set positions of the plurality of reference marks, to determine a second relationship to approximately obtain the positions of the plurality of reference marks measured by the second measurement unit from the set positions of the plurality of reference marks, to determine a third relationship to approximately obtain the positions of the plurality of marks on the substrate measured by the second measurement unit from set positions of the plurality of marks on the substrate, and to calculate positions of marks on the substrate, and to calculate positions of regions on the substrate to be exposed to the light based on set positions of the regions, the third relationship, and a difference between the first and second relationships.

According to the present invention, the foregoing object is attained by providing a method of manufacturing a device, the method comprising steps of:

exposing a substrate to light through an original using an exposure apparatus according to various aspects of the present invention;

developing the exposed substrate; and processing the developed substrate to manufacture the device.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 13 is a flowchart showing the flow of the wafer process of FIG. 12 in detail.

DETAILED DESCRIPTION OF THE PREFERRED EMBODIMENTS

Preferred embodiment(s) of the present invention will be described in detail in accordance with the accompanying drawings.

First Embodiment

The first embodiment of the present invention will be described.

Figure 2:
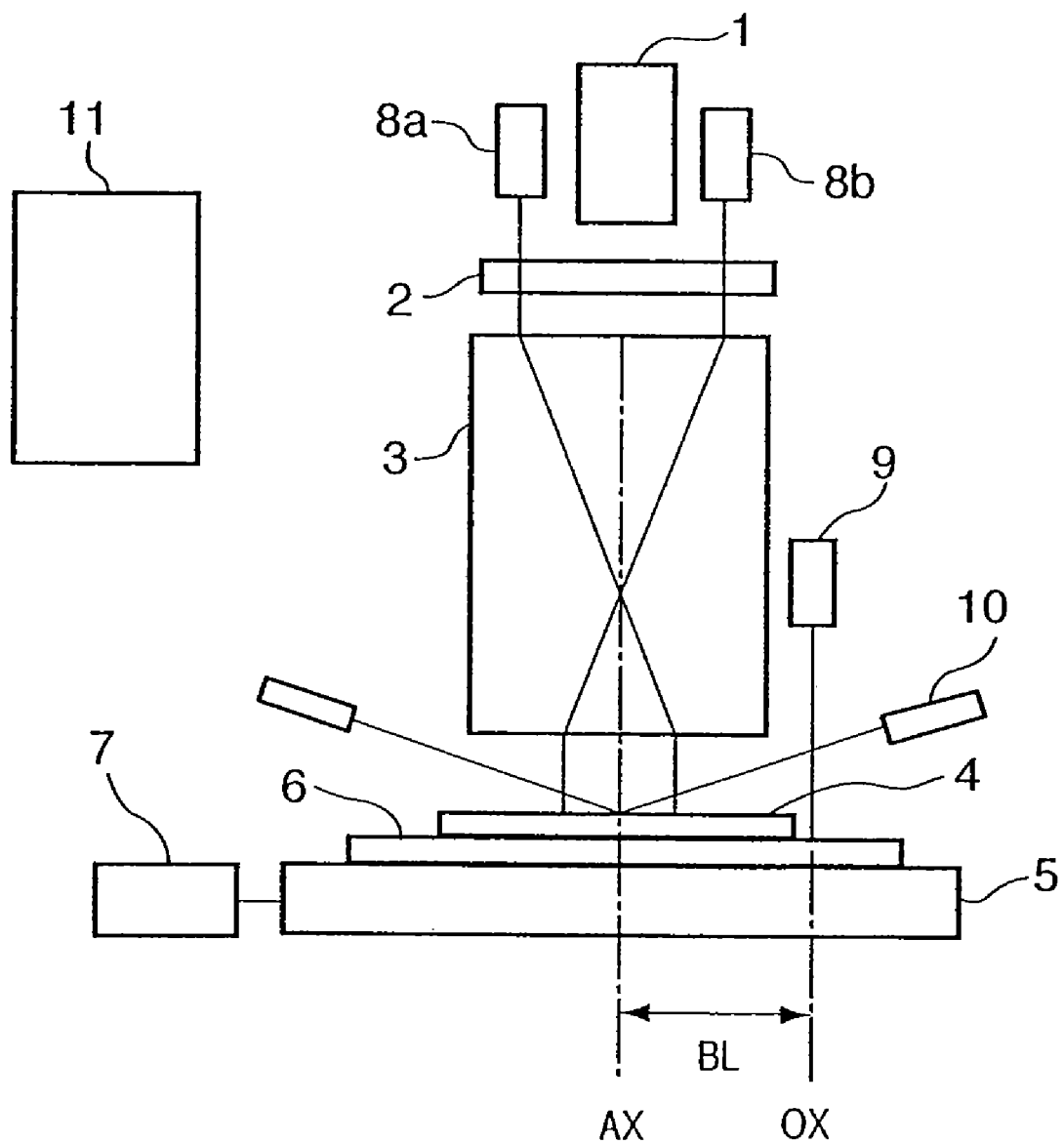
FIG. 2 is a view showing the structure of an exposure apparatus to which the first embodiment of the present invention is applied.

The first embodiment is an improvement over the exposure apparatus according to the first prior art arrangement of FIG. 2.

According to the first embodiment, the stage drive characteristic is measured at a measurement position in substrate pattern position measurement, which measures the pattern position on a substrate (wafer), and at an exposure position in an exposure step of projecting the pattern of an original (reticle) onto the substrate and exposing the substrate to light. The stage drive characteristic difference is obtained from the measurement results, and a process based on the stage drive characteristics difference is performed during wafer pattern measurement or exposure. More specifically, a plurality of reference members each having a reference mark are arranged on a wafer stage 5. The respective reference marks of the plurality of reference members are measured at the measurement position and exposure position by using one detection system to obtain a stage drive characteristic difference.

For example, assume that the stage drive characteristic (stage drive characteristic difference) with respect to the exposure position includes an X-direction magnification $M_{sx}$, Y-direction magnification $M_{sy}$, X-direction rotation $\theta_{sx}$, and Y-direction rotation $\theta_{sy}$. In this case, an alignment error of $M_{sx}*x+\theta_{sx}*y$ in the X direction and an alignment error of $\theta_{sy}*x+M_{sy}*y$ in the Y direction occur.

Note that x and y indicate the designed position of each shot on the wafer. In the first embodiment, $M_{sx}$, $\theta_{sx}$, $M_{sy}$, and $\theta_{sy}$ are measured in the following manner.

First, the reference mark positions on the plurality of reference members are measured by using an OA alignment detection system 9. Then, drive magnification offsets $M_{s1x}$ and $M_{s1y}$, drive rotations $\theta_{s1x}$ and $\theta_{s1y}$, and shift amounts $S_{s1x}$ and $S_{s1y}$, which are the stage drive characteristics at the measurement position, are measured.

These drive characteristics can be calculated with the method of least squares in the same manner as with the correction equations for global alignment by calculating, from the plurality of reference mark measurement positions, the coefficients of the following equations (3) and (4):

$$d_{s1x}=M_{s1x}*x+\theta_{s1x}*y+S_{s1x} \quad (3)$$

$$d_{s1y}=\theta_{s1y}*x+M_{s1y}*y+S_{s1y} \quad (4)$$

where $d_{s1x}$ and $d_{s1y}$ are the error amounts of each reference mark position from its designed position (x, y).

Subsequently, the plurality of reference mark positions are measured by using TTL alignment detection system 8a and 8b. Then, drive magnification offsets $M_{s2x}$ and $M_{s2y}$, drive rotations $\theta_{s2x}$ and $\theta_{s2y}$, and shift amounts $S_{s2x}$ and $S_{s2y}$, which are the stage drive characteristics at the exposure position, are measured. These drive characteristics can also be calculated with the method of least squares in the same manner as with the correction equations for global alignment by calculating, from the plurality of reference mark measurement positions, the coefficients of the following equations (5) and (6):

$$d_{s2x}=M_{s2x}*x+\theta_{s2x}*y+S_{s2x} \quad (5)$$

$$d_{s2y}=\theta_{s2y}*x+M_{s2y}*y+S_{s2y} \quad (6)$$

where $d_{s2x}$ and $d_{s2y}$ are the error amounts of each reference mark position from its designed position (x, y).

Finally, the stage drive characteristic difference between the two measurement positions is calculated from the respective stage drive characteristics at the measurement position and exposure position by using the following equations (7), (8), (9), and (10):

$$M_{sx}=M_{s1x}/M_{s2x} \quad (7)$$

$$M_{sy}=M_{s1y}/M_{s2y} \quad (8)$$

$$\theta_{sx}=\theta_{s1x}-\theta_{s2x} \quad (9)$$

$$\theta_{sy}=\theta_{s1y}-\theta_{s2y} \quad (10)$$

Note that $S_{sx}$ and $S_{sy}$, which can be calculated by the following equations (11) and (12), indicate the base line error amounts (differences between a base line amount BL with which the stage has been drive at the time of measurement and the measured base line amount) in the X and Y directions:

$$S_{sx} = S_{s1x} - S_{s2x} \quad (11)$$

$$S_{sy} = S_{s1y} - S_{s2y} \quad (12)$$

To obtain the coefficients of equations (3), (4), (5), and (6), three or more reference mark measurement values ($d_{s1x}$, $d_{s1y}$, $d_{s2x}$, and $d_{s2y}$) are necessary at least at each stage position. To measure the stage drive characteristics, three or more reference marks must be measured.

Note that the difference in drive magnification offset and that in drive rotation between X and Y directions are constant and known ($M_{s1x} = M_{s1y} + C_1$, $\theta_{s1x} = \theta_{s1y} + C_2$, $M_{s2x} = M_{s2y} + C_3$, $\theta_{s2x} = \theta_{s2y} + C_4$, where $C_1$, $C_2$, $C_3$, and $C_4$ are known constants). In this case, the stage drive characteristics can be calculated by measuring only two or more reference marks.

The first embodiment will be described in detail.

The outline of an exposure apparatus according to the first embodiment is the same as that of the exposure apparatus of the first prior art arrangement shown in FIG. 2, except for the arrangement of the reference members having reference marks.

The layout of the reference members having reference marks of the first embodiment will be described with reference to FIG. 3.

Figure 3:
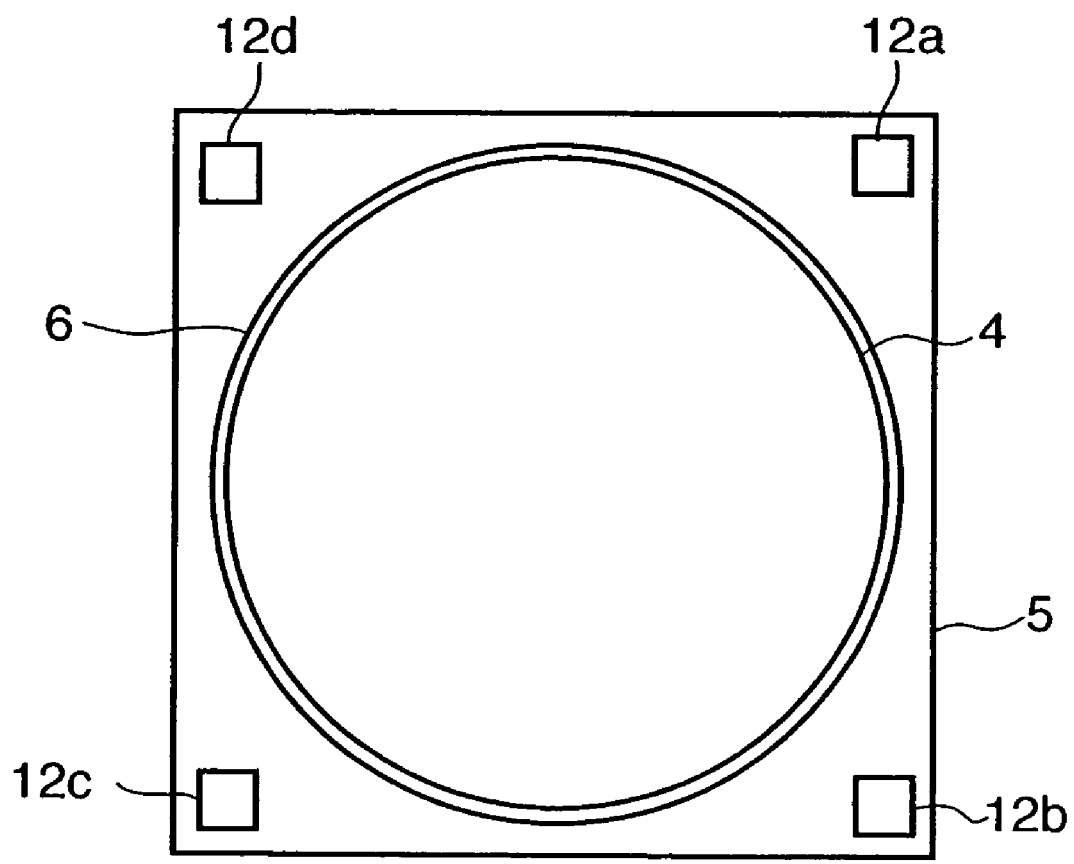
FIG. 3 is a view showing the arrangement of reference members according to the first embodiment of the present invention.

FIG. 3 schematically shows a wafer stage of the first embodiment seen from the direction of a projection optical system.

According to the first embodiment, reference members 12a to 12d, each having a reference mark, are arranged on a wafer stage 5. FIG. 3 shows a case wherein four reference members, each having a reference mark, are arranged. The number of reference members having reference marks is not limited to four, but can be any number equal to two or more. A plurality of reference marks can be formed on one reference member.

Figure 1:
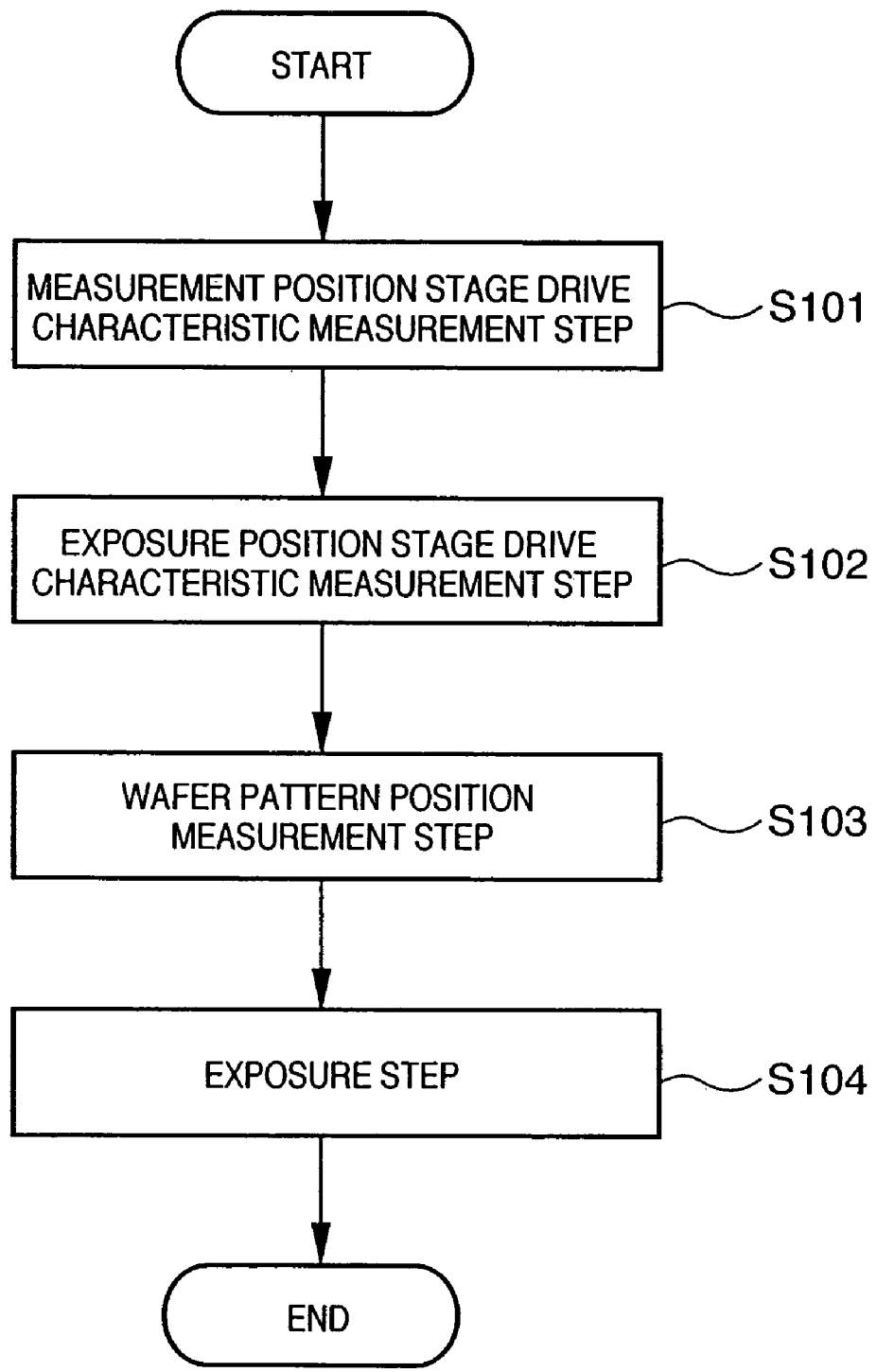
FIG. 1 is a flowchart showing an exposure method according to the first embodiment of the present invention.

An exposure method according to the first embodiment will be described with reference to FIG. 1.

Step S101 is a measurement position stage drive characteristic measurement step. In step S101, the wafer stage drive 5 is driven to measure the respective reference marks on the plurality of reference members 12a to 12d by the OA alignment detection system 9. Then, the stage drive characteristics $M_{s1x}$, $M_{s1y}$, $\theta_{s1x}$, and $\theta_{s1y}$, and the shift amounts $S_{s1x}$ and $S_{s1y}$ at the measurement position are measured. The stage drive characteristics are calculated in the same manner as described above.

Step S102 is an exposure position stage drive characteristic measurement step. In step S102, the wafer stage 5 is driven to measure the respective reference marks on the plurality of reference members 12a to 12d by TTL alignment detection systems 8a and 8b. Then, the stage drive characteristics $M_{s2x}$, $M_{s2y}$, $\theta_{s2x}$, and $\theta_{s2y}$, and the shift amounts $S_{s2x}$ and $S_{s2y}$ at the exposure position are measured. The stage drive characteristics are calculated in the same manner as described above.

Step S103 is a wafer pattern position measurement step. In step S103, an alignment mark on a wafer 4 is measured by the OA alignment detection system 9, in the same manner as in the prior art, to measure the position error amount of a pattern on the wafer 4.

Step S104 is an exposure step. In step S104, the stage drive characteristic difference is calculated from the measurement position stage drive characteristics measured in step S101 and the stage drive characteristics at the exposure position measured in step S102. Then, the wafer stage 5 is driven on the basis of a value, which is obtained by correcting the position error amount of the pattern on the wafer 4 measured in step S103 by the calculated stage drive characteristic difference, to transfer the pattern of a reticle 2 onto the wafer 4.

The measurement position stage drive characteristic measurement step and exposure position stage drive characteristic measurement step need not always be performed for each exposure. The stage drive characteristic difference may be stored in a storage medium (e.g., a memory in a controller 11), and after that, the measured values may be used.

For example, the measurement position stage drive characteristic measurement step and exposure position stage drive characteristic measurement step may be performed when a predetermined number of wafers are processed, at a lapse of a predetermined period of time, or non-periodically, to acquire a stage drive characteristic difference, and the acquired difference may be stored in a storage medium (e.g., the memory in the controller 11). After that, each stored stage drive characteristic difference may be used. The wafer pattern position measurement step and exposure step need not always be performed after the measurement position stage drive characteristic measurement step and exposure position stage drive characteristic measurement step are performed.

The reference marks on all the reference members need not be measured each time. For example, only some reference marks may be measured. Only when the stage drive characteristic difference is supposed to have changed, the reference marks on all the reference members may be measured to update the stored stage drive characteristic difference.

For example, usually, the base line measurement step may be performed in the same manner as in the prior art, to update only the base line amount BL. Only when a change in base line amount BL exceeds a preset value, the stage drive characteristic difference may be measured and updated. The stage drive magnification can be calculated by measuring only two reference marks. Thus, the stage drive characteristic differences may be measured and updated only when the change amount of the drive magnification exceeds a preset value.

In this manner, when the timing for measuring the stage drive characteristic difference and the number of reference marks to be measured are changed in accordance with the device manufacturing process and product, a decrease in throughput can be minimized.

While the first embodiment is exemplified by a case wherein the stage drive characteristic difference is corrected in the exposure step, the present invention is not limited to this. For example, when a stage drive characteristic difference measured in advance is to be used, the wafer stage position in alignment mark measurement of the wafer pattern position measurement step may be corrected by using the stage drive characteristic difference. Alternatively, the wafer stage position may be corrected in both the exposure step and wafer pattern position measurement step.

In addition, although the prior art describes a case wherein the drive characteristic difference between the stages is approximated by an equation of the first degree, the drive characteristic difference may be approximated by other equations, including a polynomial.

For example, when an equation of the third degree is employed, the wafer stage position can be corrected even if the stage drive characteristic shows a curve (is arcuate). When the stage drive characteristic is approximated by a polynomial, it can be calculated by calculating the respective coefficients by the method of least squares in the same manner as in Japanese Patent Laid-Open No. 9-218714, described above.

As described above, according to the first embodiment, an overlapping error caused by a change over time, or the like, of the stage drive characteristic difference can be suppressed by measuring and correcting the stage drive characteristic difference between the measurement position and exposure position.

Second Embodiment

The second embodiment of the present invention will be described.

Figure 5:
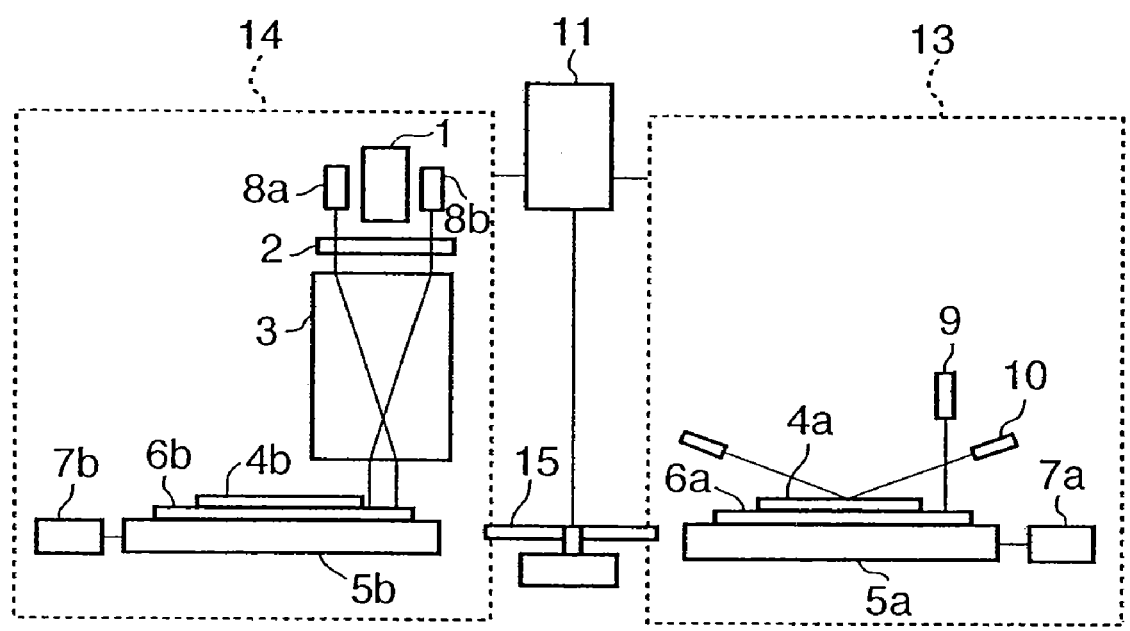
FIG. 5 is a view showing the structure of an exposure apparatus to which the second embodiment of the present invention is applied.

The second embodiment is an improvement over the exposure apparatus according the second prior art of FIG. 5.

According to the second embodiment, the stage drive characteristic is measured at a wafer stage 5a (to be referred to as a measurement stage hereinafter) of a measurement station 13 and at a wafer stage (to be referred to an exposure stage hereinafter) of an exposure station 14, and the difference between the two characteristics is corrected during exposure.

More specifically, a plurality of reference members, each having a reference mark, are arranged on each of the wafer chucks 6a and 6b, and the plurality of reference marks are measured on the measurement stage and exposure stage. Thus, the drive characteristic difference between the stages is measured and corrected. The basic idea of how to measure the stage drive characteristic difference is similar to that of the first embodiment, but is different from the first embodiment in the following respects.

According to the first embodiment, the reference marks of the reference members on the wafer stage are measured by the OA alignment detection system and TTL alignment detection systems. In contrast to this, according to the second embodiment, the reference marks of reference members on the wafer chucks, serving as wafer supports, are measured by an OA alignment detection system and TTL alignment detection systems. Also, the stage drive characteristic difference is calculated in a manner slightly different from that of the first embodiment, which will be described hereinafter.

First, the reference mark positions on the plurality of reference members are measured by using an OA alignment detection system 9. Then, drive magnification offsets $M_{s1x}$, and $M_{s1y}$, drive rotations $\theta_{s1x}$ and $\theta_{s1y}$, chuck position error amounts $S_{c1x}$ and $S_{c1y}$, and a chuck rotation amount $\theta_{c1}$, which are the stage drive characteristics at the measurement stage, are measured. These drive characteristics can be calculated with the method of least squares in the same manner as with the correction equations for global alignment by calculating, from the respective reference mark measurement positions on the plurality of reference members, the coefficients of the following equations (13 and 14):

$$d_{s1x}=M_{s1x}*x+(\theta_{s1x}+\theta_{c1})*y+S_{c1x} \quad (13)$$

$$d_{s1y}=(\theta_{s1y}+\theta_{c1})*x+M_{s1y}+S_{s1y} \quad (14)$$

where $d_{s1x}$ and $d_{s1y}$ are the error amounts of each reference mark position from its designed position (x, y).

Subsequently, the respective reference mark positions of the plurality of reference members are measured by using TTL alignment detection systems 8a and 8b. Then, drive magnification offsets $M_{s2x}$ and $M_{s2y}$, drive rotations $\theta_{s2x}$ and $\theta_{s2y}$, chuck position error amounts $S_{c1x}$ and $S_{c1y}$, and chuck rotation amounts $\theta_{c2}$, which are the stage drive characteristics at the exposure stage, are measured. These drive characteristics can also be calculated with the method of least squares in the same manner as with the correction equations for global alignment by calculating, from the plurality of reference mark measurement positions, the coefficients of the following equations (15) and (16):

$$d_{s2x}=M_{s2x}*x+(\theta_{s2x}+\theta_{c2})*y+S_{c2x} \quad (15)$$

$$d_{s2y}=(\theta_{s2x}+\theta_{c2})*x+M_{s2y}+S_{s2y} \quad (16)$$

where $d_{s2x}$ and $d_{s2y}$ are the error amounts of each reference mark position from its designed position (x, y).

Finally, the stage drive characteristic difference between the two measurement positions is calculated from the respective stage drive characteristics at the measurement position and exposure position by using the following equations (17), (18), (19), and (20):

$$M_{sx}=M_{s1x}/M_{s2x} \quad (17)$$

$$M_{sy}=M_{s1y}/M_{s2y} \quad (18)$$

$$\theta_{sx}=\theta_{s1x}-\theta_{s2x} \quad (19)$$

$$\theta_{sy}=\theta_{s1y}-\theta_{s2y} \quad (20)$$

Note that the chuck position error amounts $S_{c1x}$, $S_{c1y}$, $S_{c2x}$ and $S_{c2y}$ and the rotation amounts $\theta_{c1}$ and $\theta_{c2}$ are the same as the chuck position error amounts and rotation amounts of the prior art.

To obtain the coefficients of equations (13), (14), (15), and (16), four or more reference mark measurement values ($d_{s1x}$, $d_{s1y}$, $d_{s2x}$, and $d_{s2y}$) are necessary at least at each stage position. To measure the stage drive characteristics, four or more reference marks must be measured.

Note that the difference in drive magnification offset and that in drive rotation between the X and Y directions are constant and known ($M_{s1x}=M_{s1y}+C_1$, $\theta_{s1x}=\theta_{s1y}+C_2$, $M_{s2x}=M_{s2y}+C3$, $\theta_{s2x}=\theta_{s2y}+C_4$, where $C_1$, $C_2$, $C_3$, and $C_4$ are known constants). In this case, measurement and correction can be performed with three or more reference marks.

The second embodiment will be described in detail below.

The outline of an exposure apparatus according to the second embodiment is the same as that of the exposure apparatus of the second prior art shown in FIG. 5, except for the arrangement of the reference members having reference marks on wafer chucks 6a and 6b, which serve as wafer supports.

The layout of the reference members having the reference marks on the wafer chucks 6a and 6b, which serve as the wafer supports of the first embodiment, will be described with reference to FIG. 6.

Figure 6:
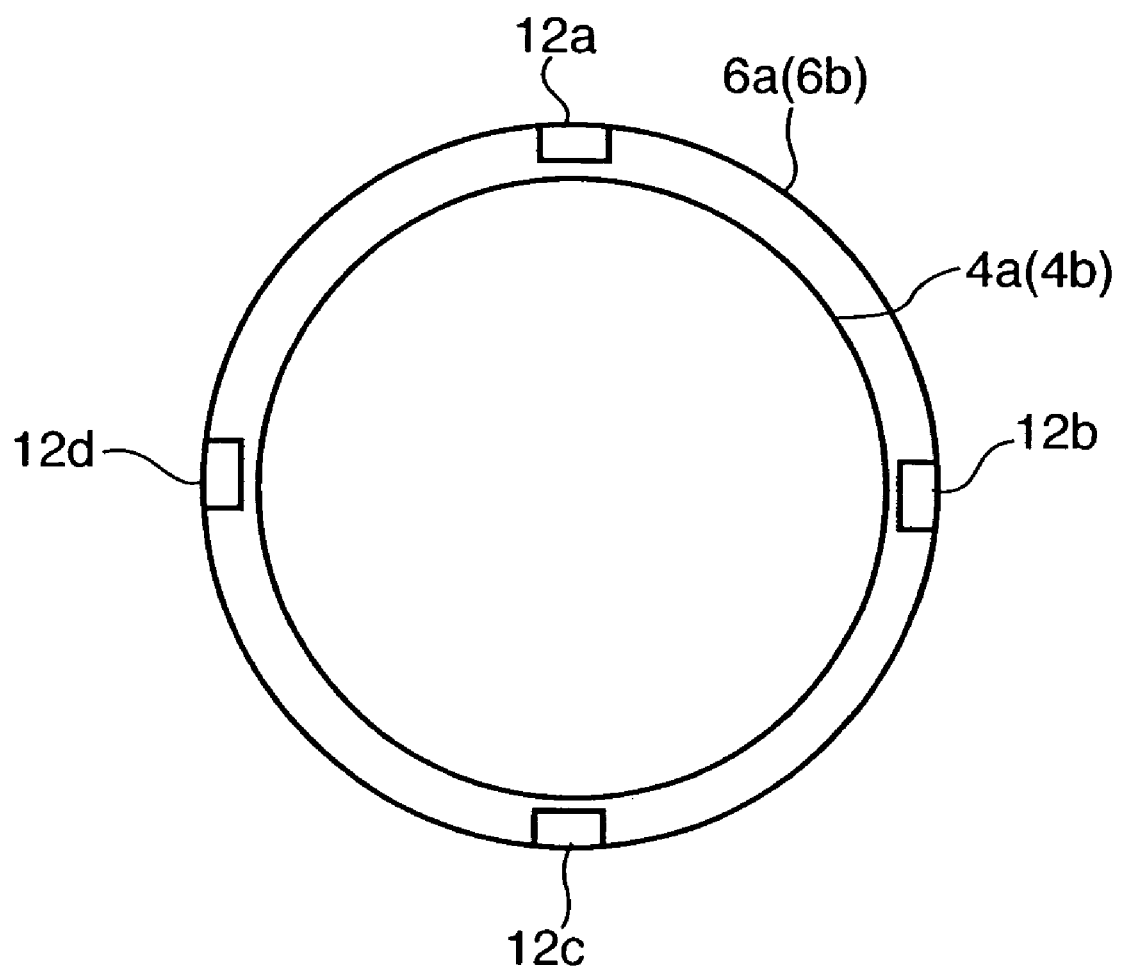
FIG. 6 is a view showing the arrangement of reference members according to the second embodiment of the present invention.
Figure 7:
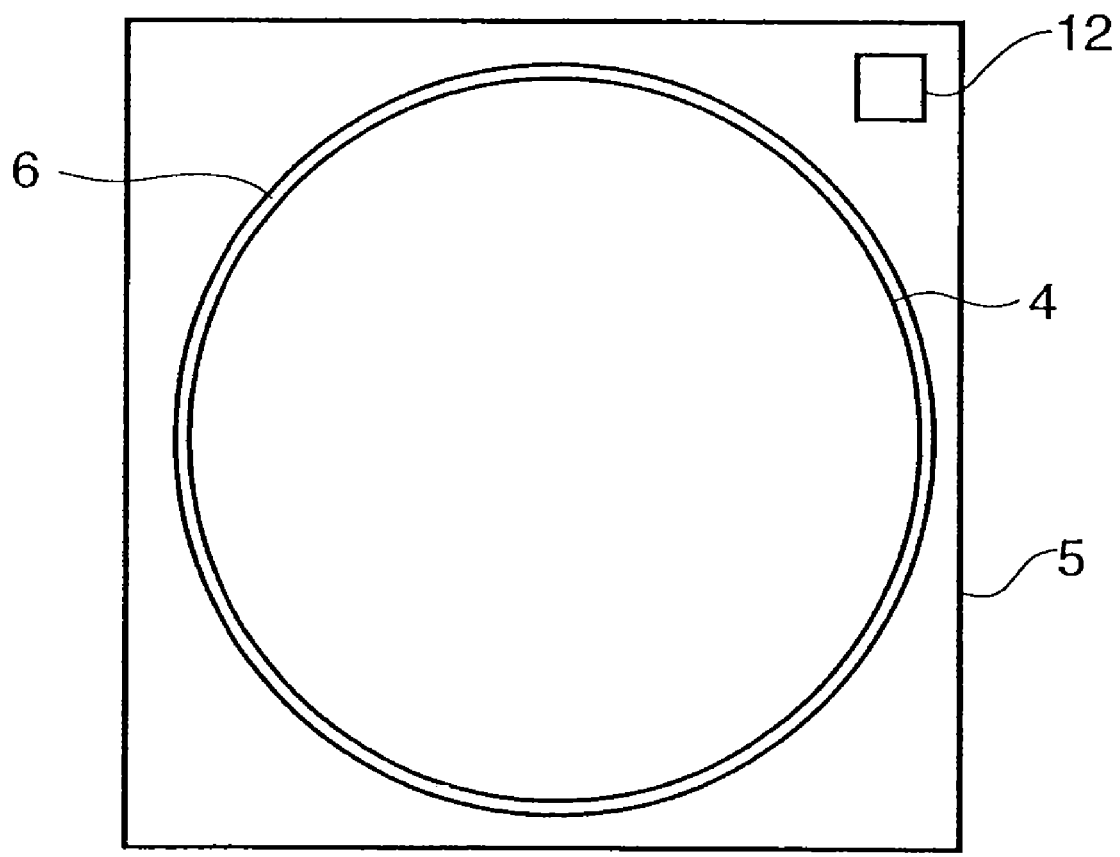
FIG. 7 is a view showing the arrangement of a reference member according to the first prior art arrangement.
Figure 8:
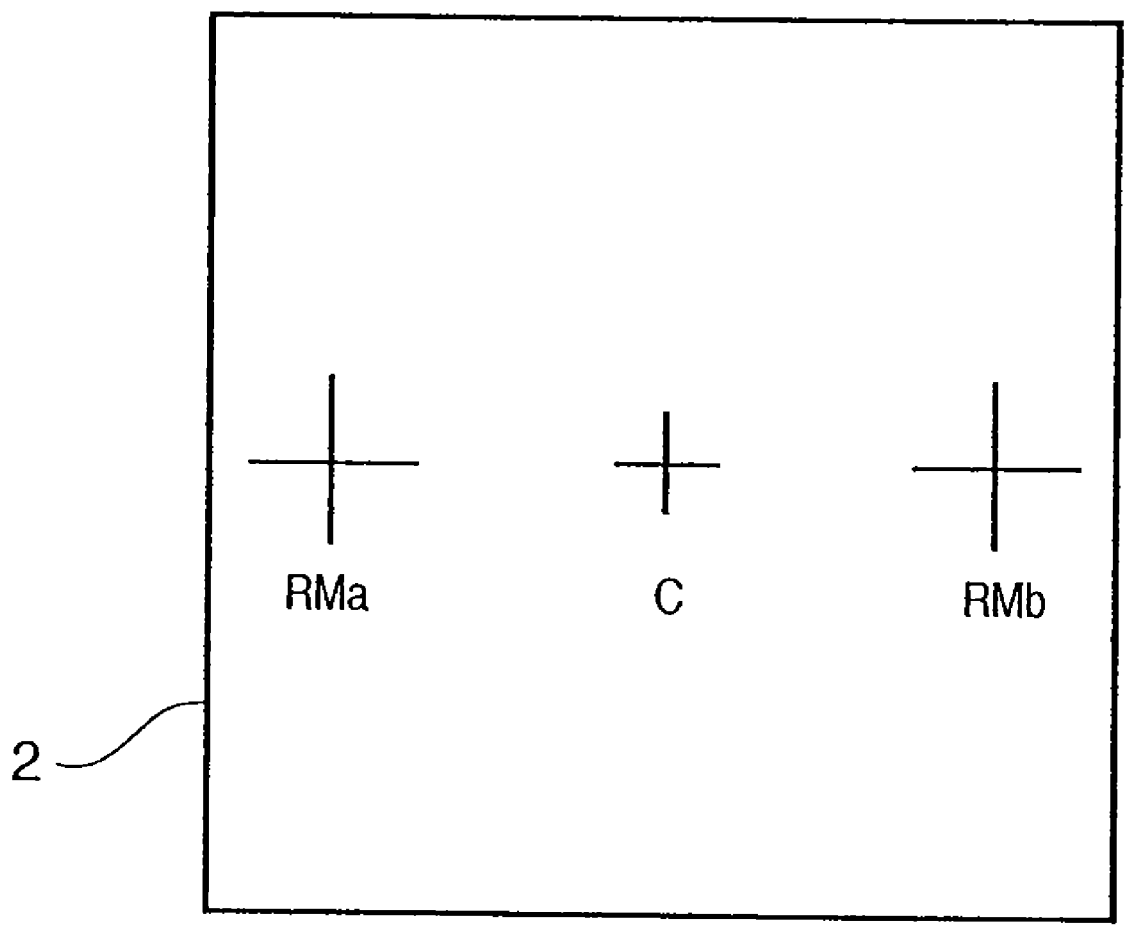
FIG. 8 is a view showing the arrangement of reticle marks according to the first prior art arrangement.
Figure 9:
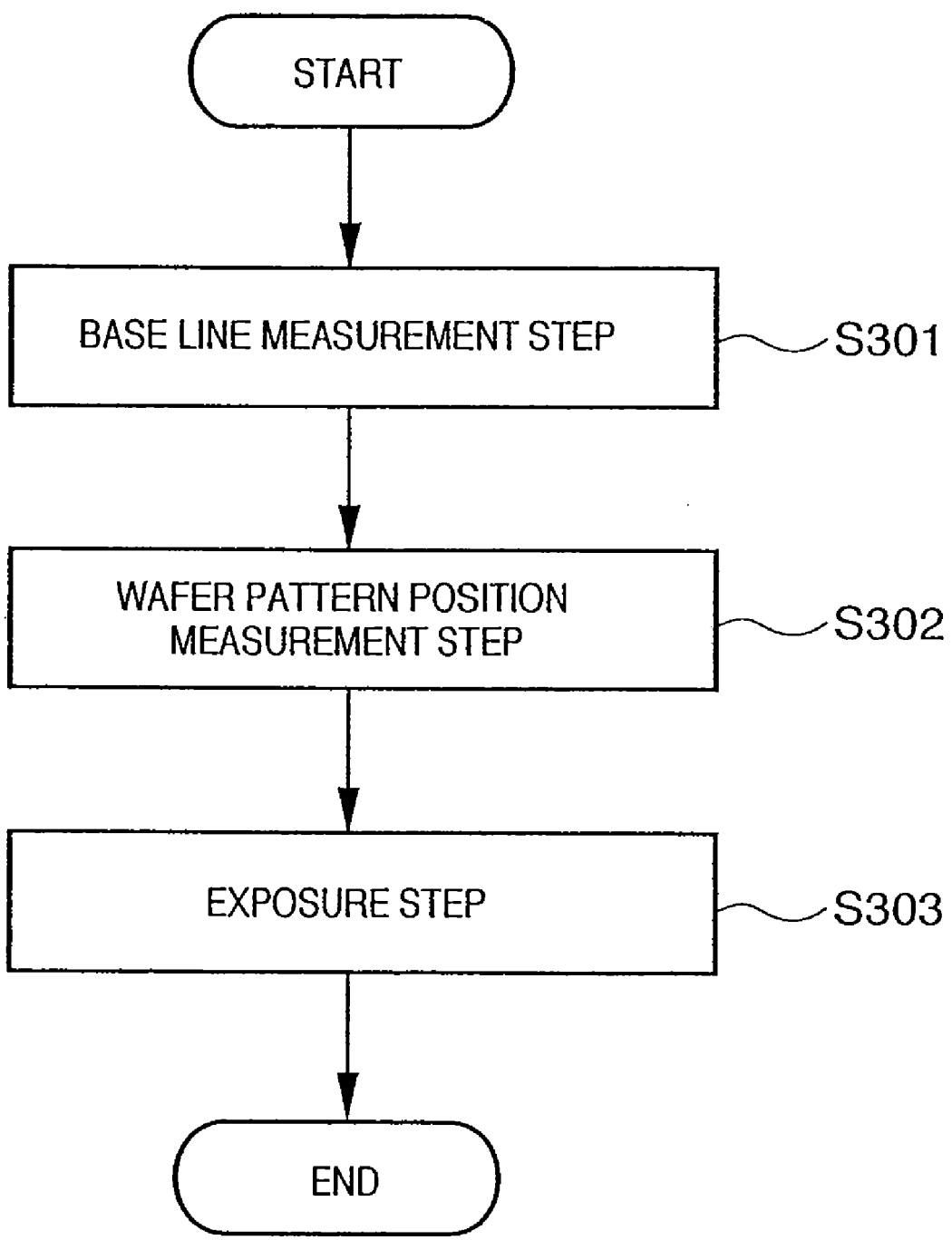
FIG. 9 is a flowchart showing an exposure method according to the first prior art arrangement.
Figure 10:
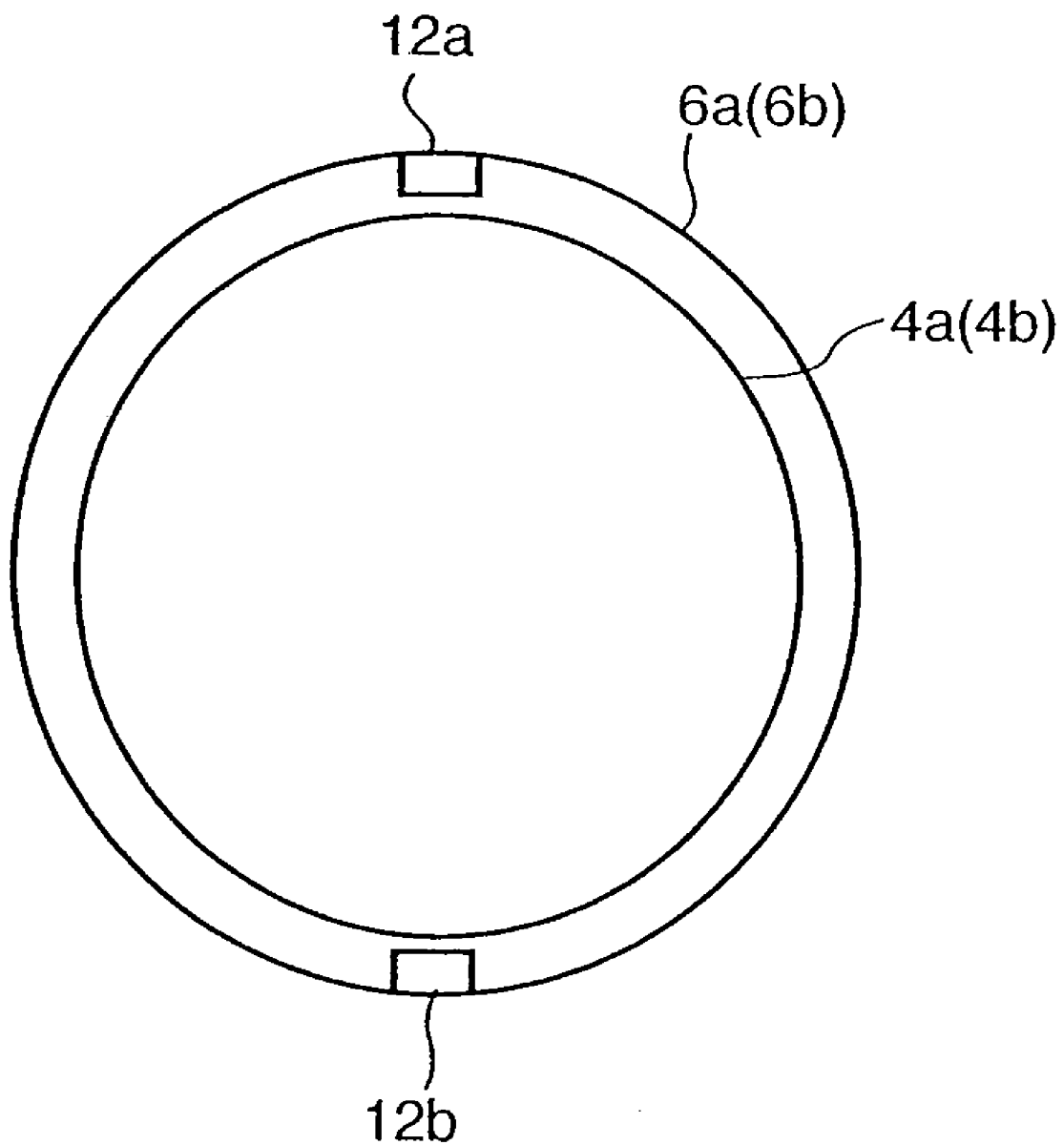
FIG. 10 is a view showing the arrangement of reference members according to the second prior art arrangement.
Figure 11:
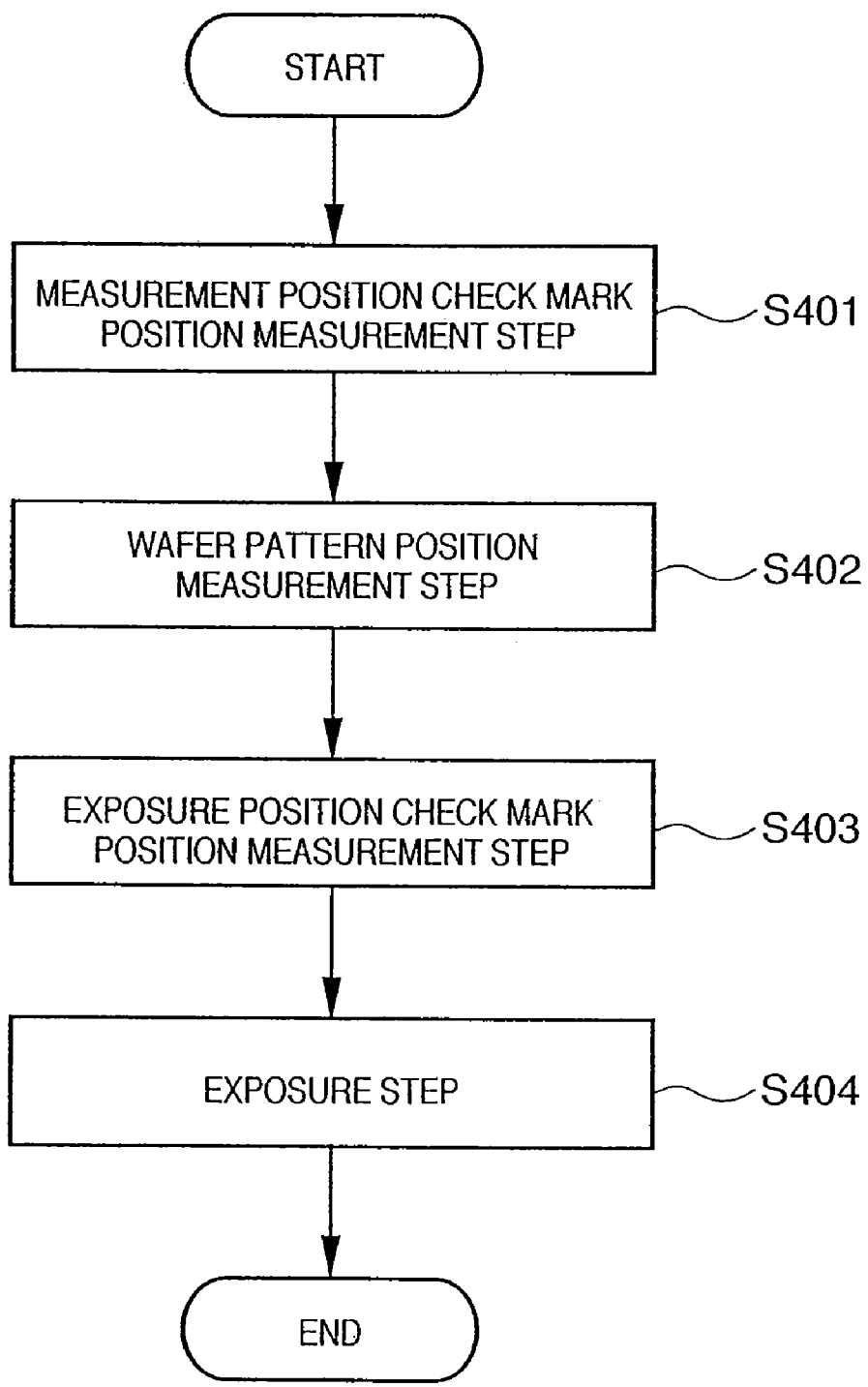
FIG. 11 is a flowchart showing an exposure method according to the second prior art arrangement.

FIG. 6 shows a wafer support means chuck according to the second embodiment seen from the direction of a projection optical system.

According to the second embodiment, a plurality of reference members 12a to 12d, each having a reference mark, are arranged on each of the wafer chucks 6a and 6b. FIG. 6 shows a case wherein four reference members, each having a reference mark, are arranged. The number of reference numbers having reference marks is not limited to four, but can be any number equal to three or more. A plurality of reference marks can be formed on one reference member.

In addition, the second embodiment also exemplifies a case wherein wafer chucks are used as substrate supports, which support wafers, when the wafers are to move between the measurement station and exposure station, in the same manner as in the second prior art arrangement, but the present invention is not limited to this. For example, the wafer stage 5a and a wafer stage 5b may be used as substrate supports when the wafers are to be moved. In this case, in place of detecting the alignment marks on the wafer chucks, alignment marks on wafer stages are detected in the same manner.

Figure 4:
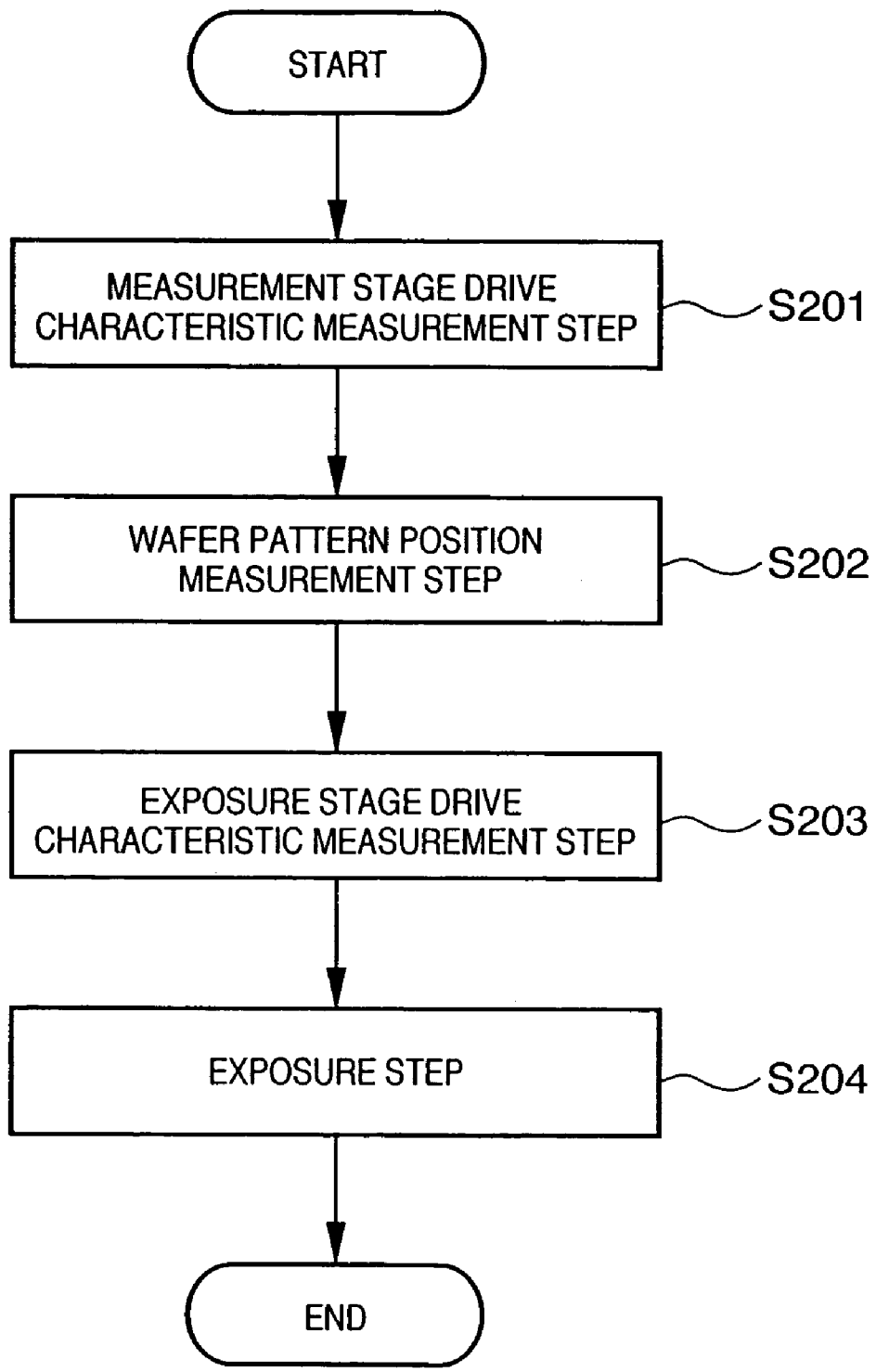
FIG. 4 is a flowchart showing an exposure method according to the second embodiment of the present invention.

An exposure method according to the second embodiment will be described with reference to FIG. 4.

Step S201 is a measurement stage drive characteristic measurement step. In step S201, the wafer stage 5a, on which a wafer 4a and the wafer chuck 6a are mounted, is driven, to measure the reference marks on the plurality of reference members 12a to 12d by the OA alignment detection system 9. Then, the stage drive characteristics at the measurement position are measured. The stage drive characteristics are calculated in the same manner as described above.

Step S202 is a wafer pattern position measurement step. In step S202, on the wafer stage 5a, alignment mark positions on the wafer 4a are measured on the wafer stage 5a by using the OA alignment detection system 9. Thus, the position of a pattern (wafer pattern) on the wafer 4a is measured. The wafer pattern position measurement step is identical to that of the prior art described above, and a detailed description thereof will be omitted.

Step S203 is an exposure stage drive characteristic measurement step. In step S203, the wafer stage 5b, on which a wafer 4b and the wafer chuck 6b used in the measurement stage drive characteristic measurement step, is driven. Reference marks on the plurality of reference members 12a to 12d are measured by the TTL alignment detection systems 8a and 8b to measure the exposure stage drive characteristics. The stage drive characteristics are calculated in the same manner as described above.

Step S204 is an exposure step. In step S204, the position of a target exposure region is calculated from the measurement stage drive characteristics measured in step S201, the position error amount of the pattern on the wafer 4a measured in step S202, and the exposure stage drive characteristics measured in step S203. Then, the wafer stage 5b is driven to the calculated position of the target exposure region to transfer the pattern of a reticle 2 onto the wafer 4b.

The measurement position stage drive characteristic measurement step and exposure position stage drive characteristic measurement step need not always be performed for each exposure. Each stage drive characteristic difference may be stored in a storage medium (e.g., a memory in a controller 11), and may be used for a subsequent exposure process.

For example, the measurement position stage drive characteristic measurement step and exposure position stage drive characteristic measurement step may be performed when a predetermined number of wafers are processed, at a lapse of a predetermined period of time, or non-periodically, to acquire a stage drive characteristic difference, and the acquired difference may be stored in a storage medium (e.g., the memory in the controller 11). After that, each stored stage drive characteristic difference may be used. The wafer pattern position measurement step and exposure step need not always be performed after the measurement position stage drive characteristic measurement step and exposure position stage drive characteristic measurement step are performed. For example, the measurement position stage drive characteristic measurement step and exposure position stage drive characteristic measurement step may be performed by using only the wafer chucks serving as the substrate supports, to measure only the stage drive characteristic difference.

The reference marks on all the reference members need not be measured each time. For example, only some reference marks may be measured. Only when the stage drive characteristic difference is supposed to have changed, the reference marks on all the reference members may be measured to update the stored image drive characteristic difference.

For example, usually, three reference marks are measured to calculate the orthogonality (X-Y difference of the drive rotation) of stage drive as one stage drive characteristic difference. Only when a change in orthogonality exceeds a preset threshold, a larger number of reference marks may be measured to calculate and update the stage drive characteristic difference.

In this manner, when the timing for measuring the stage drive characteristic difference and the number of reference marks to be measured are changed in accordance with the device manufacturing process and product, a decrease in throughput can be minimized.

While the second embodiment is exemplified by a case wherein the stage drive characteristic difference is corrected in the exposure step, the present invention is not limited to this. For example, when a stage drive characteristic difference measured in advance is to be used, the wafer stage position in alignment mark measurement of the wafer pattern position measurement step may be corrected by using the stage drive characteristic difference. Alternatively, the wafer stage position may be corrected in both the exposure step and wafer pattern position measurement step.

In addition, although the prior art describes a case wherein the drive characteristic difference between the stages is approximated by an equation of the first degree, the drive characteristic difference may be approximated by other equations, including a polynomial.

For example, when an equation of the third degree is employed, the wafer stage position can be corrected even if the stage drive characteristic shows a curve (is arcuate). When the stage drive characteristic is approximated by a polynomial, it can be calculated by calculating the respective coefficients by the method of least squares in the same manner as in Japanese Patent Laid-Open No. 9-218714, described above.

As described above, according to the second embodiment, an overlapping error caused by a change over time, or the like, of the stage drive characteristic difference can be suppressed by measuring and correcting the stage drive characteristic difference between the measurement stage (measurement position) and exposure stage (exposure position).

The first and second embodiments are exemplified by the cases wherein the reference members having the reference marks are formed on the wafer stages or wafer chucks. Alternatively, the reference marks themselves may be formed on the wafer stages or wafer chucks.

[Application of an Exposure Apparatus]

A semiconductor device manufacturing process, which uses the exposure apparatus described above, will be described.

Figure 12:
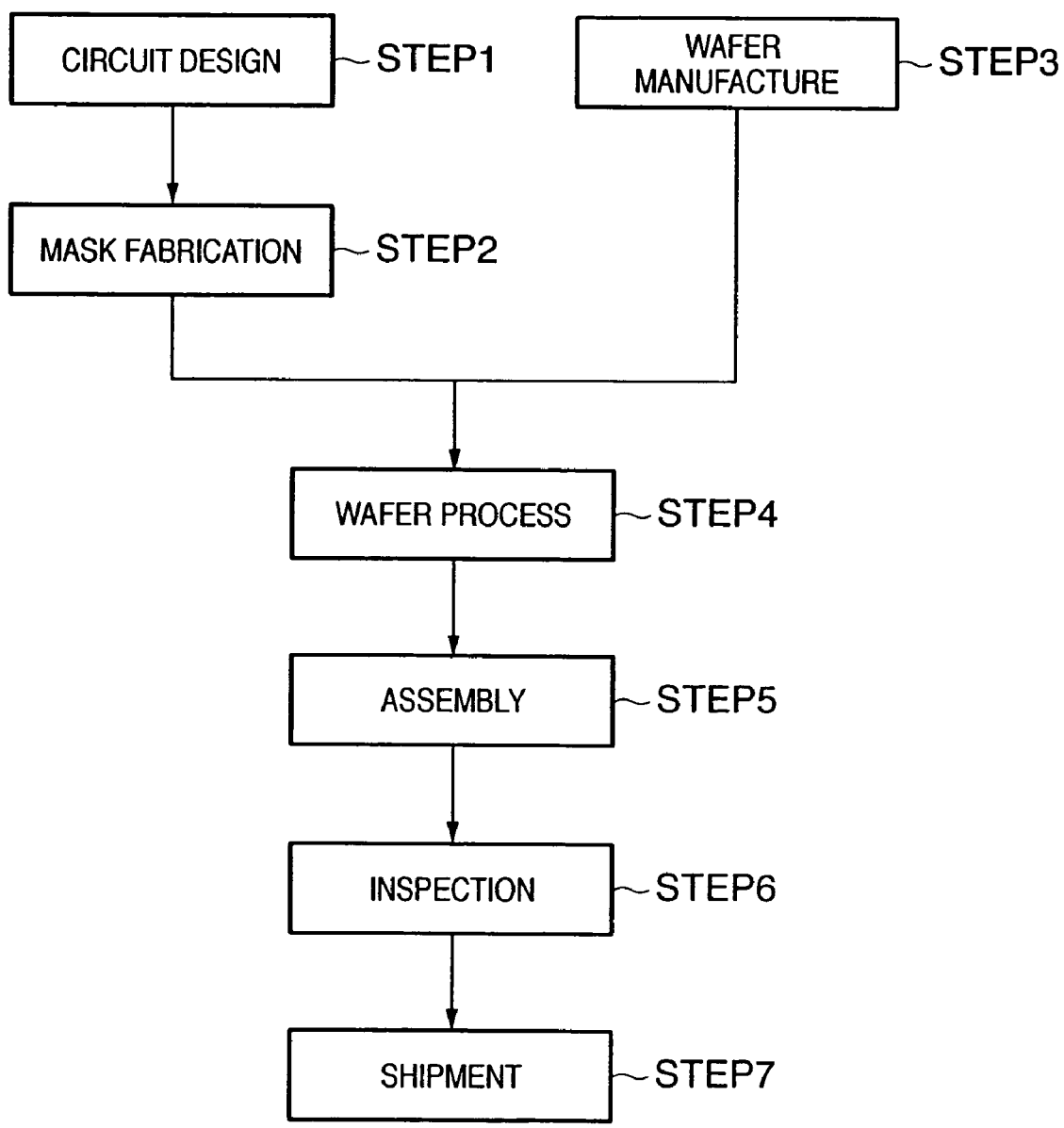
FIG. 12 is a flowchart showing the flow of an overall semiconductor device manufacturing process.

FIG. 12 is a flowchart showing the flow of the overall semiconductor device manufacturing process. In step 1 (circuit design), the circuit of a semiconductor device is designed. In step 2 (mask fabrication), a mask is fabricated on the basis of the designed circuit pattern. In step 3 (wafer manufacture), a wafer is manufactured using a material such as silicon. In step 4 (wafer process), called a pre-process, an actual circuit is formed on the wafer in accordance with lithography using the above mask and wafer.

In the next step, step 5 (assembly), called a post-process, a semiconductor chip is formed from the wafer fabricated in step 4. This step includes assembly processes, such as assembly (dicing and bonding) and packaging (chip encapsulation). In step 6 (inspection), inspections, such as an operation check test and a durability test of the semiconductor device fabricated in step 5, are performed. A semiconductor device is finished with these steps and shipped (step 7).

FIG. 13 is a flowchart showing the flow of the above wafer process in detail.

In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted in the wafer. In step 15 (resist process), a photosensitive agent is applied to the wafer.

In step 16 (exposure), the circuit pattern is transferred to the wafer by the above exposure apparatus. In step 17 (development), the exposed wafer is developed. In step 18 (etching), portions other than the developed resist image are removed. In step 19 (resist removal), any unnecessary resist after etching is removed. These steps are repeated to form multiple circuit patterns on the wafer.

As many apparently widely different embodiments of the present invention can be made without departing from the spirit and scope thereof, it is to be understood that the invention is not limited to the specific embodiments thereof, except as defined in the appended claims.

What is claimed is:

1. An exposure method of exposing a substrate arranged on a stage, which holds the substrate and moves, to light through an original and a projection optical system, said method comprising steps of:
    a first measurement of measuring a first drive characteristic of the stage by detecting a position of a pattern on the stage using a first detection system which detects a position of a pattern on the substrate through an optical system which does not comprise the projection optical system;
    a second measurement of measuring a second drive characteristic of the stage by detecting the position of the pattern on the stage using a second detection system which detects the position of the pattern on the stage through the projection optical system; and
    aligning the original and the substrate based on the first and second drive characteristics.

2. A method according to claim 1, wherein said first and second measurement steps measure positions with respect to a same reference mark on the stage, respectively.

3. A method according to claim 1, wherein said first measurement step is performed at a measurement station, said second measurement step is performed at an exposure station, and said first and second measurement steps measure positions with respect to a same reference mark on one of a substrate chuck and the stage, respectively.

4. A method according to claim 1, further comprising a step of storing a difference between the first and second drive characteristics in a storage medium, wherein said aligning step aligns the original and the substrate based on the difference stored in the storage medium.

5. A method according to claim 1, wherein said first and second measurement steps are performed on each substrate to be exposed.

6. A method according to claim 1, wherein said second measurement step is performed if a change amount of the first drive characteristic exceeds a tolerance.

7. A method according to claim 1, wherein each of the first and second characteristics comprises at least one of a drive magnification offset and a drive rotation.

8. An exposure method of exposing a substrate arranged on a movable stage to light through an original and a projection optical system, said method comprising steps of:
    a first measurement of measuring positions of a plurality of reference marks on the movable stage by using a first measurement system which sequentially measures the positions of the plurality of reference marks through the projection optical system;
    a first determination of determining a first relationship to approximately obtain the plurality of positions measured in said first measurement step from set positions of the plurality of reference marks;
    a second measurement of measuring the positions of the plurality of reference marks by using a second measurement system which sequentially measures the positions of the plurality of reference marks though an optical system which does not include the projection optical system;
    a second determination of determining a second relationship to approximately obtain the plurality of positions measured in said second measurement step from the set positions of the plurality of reference marks;
    a third measurement of measuring positions of a plurality of marks on the substrate held by the movable stage by using the second measurement system;
    a third determination of determining a third relationship to approximately obtain the plurality of positions measured in said third measurement step from set positions of the plurality of marks on the substrate; and
    a calculation of calculating positions of regions on the substrate to be exposed to the light based on set positions of the regions, the third relationship and a difference between the first and second relationships.

9. A method according to claim 8, wherein the plurality of reference marks on the movable stage comprise a plurality of marks formed on a chuck which supports the substrate.

10. An exposure apparatus for exposing a substrate to light through an original, said apparatus comprising:
    a projection optical system configured to project a pattern of the original onto the substrate;
    a stage configured to hold the substrate and to move;
    a first measurement unit configured to measure a position of a pattern on the substrate and a position of a pattern on said stage, said first measurement unit comprising an optical system which does not comprise said projection optical system; and
    a second measurement unit configured to measure the position of the pattern on said stage through said projection optical system,
    wherein the original and the substrate are aligned based on a measurement result by said first measurement unit, a measurement result by said second measurement unit, a drive characteristic of said stage for measurement by said first measurement unit, and a drive characteristic of said stage for measurement by said second measurement unit.

11. An exposure apparatus for exposing a substrate to light through an original, said apparatus comprising:
    a projection optical system configured to project a pattern of the original onto the substrate;
    a chuck configured to hold the substrate;
    a stage configured to hold said chuck and to move;
    a first measurement unit configured to measure a position of a pattern on the substrate and a position of a pattern on said chuck, said first measurement unit comprising an optical system which does not comprise said projection optical system; and
    a second measurement unit configured to measure the position of the pattern on said chuck through said projection optical system,
    wherein the original and the substrate are aligned based on a measurement result by said first measurement unit, a measurement result by said second measurement unit, a drive characteristic of said stage for measurement by said first measurement unit, and a drive characteristic of said stage for measurement by said second measurement unit.

12. An exposure apparatus for exposing a substrate to light through an original, said apparatus comprising:
- a projection optical system configured to project a pattern of the original onto the substrate;
- a stage configured to hold the substrate and to move;
- a first measurement unit configured to sequentially measure positions of a plurality of reference marks on said stage through said projection optical system;
- a measurement optical system which does not comprise said projection optical system;
- a second measurement unit configured to sequentially measure any of the positions of the plurality of reference marks and positions of a plurality of marks on the substrate held by said stage through said measurement optical system; and
- a controller configured to determine a first relationship to approximately obtain the positions of the plurality of reference marks measured by said first measurement unit from set positions of the plurality of reference marks, to determine a second relationship to approximately obtain the positions of the plurality of reference marks measured by said second measurement unit from the set positions of the plurality of reference marks, to determine a third relationship to approximately obtain the positions of the plurality of marks on the substrate measured by said second measurement unit from set positions of the plurality of marks on the substrate, and to calculate positions of regions on the substrate to be exposed to the light based on set positions of the regions, the third relationship, and a difference between the first and second relationships.

13. A method of manufacturing a device, said method comprising steps of:
- exposing a substrate to light through an original using an exposure apparatus as defined in claim 10;
- developing the exposed substrate; and
- processing the developed substrate to manufacture the device.

14. A method of manufacturing a device, said method comprising steps of:
- exposing a substrate to light through an original using an exposure apparatus as defined in claim 11;
- developing the exposed substrate; and
- processing the developed substrate to manufacture the device.

15. A method of manufacturing a device, said method comprising steps of:
- exposing a substrate to light through an original using an exposure apparatus as defined in claim 12;
- developing the exposed substrate; and
- processing the developed substrate to manufacture the device.

* * * * *